US011442358B2

(12) United States Patent
Kusaka

(10) Patent No.: US 11,442,358 B2
(45) Date of Patent: Sep. 13, 2022

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Atsushi Kusaka, Shimotsuke (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 798 days.

(21) Appl. No.: 16/235,086

(22) Filed: Dec. 28, 2018

(65) Prior Publication Data
US 2019/0212645 A1 Jul. 11, 2019

(30) Foreign Application Priority Data
Jan. 5, 2018 (JP) .............................. JP2018-000771

(51) Int. Cl.
*G03F 7/00* (2006.01)
*B29C 59/02* (2006.01)

(52) U.S. Cl.
CPC ............ *G03F 7/0002* (2013.01); *B29C 59/02* (2013.01)

(58) Field of Classification Search
CPC ..... G03F 7/0002; E01H 10/005; E02D 29/12; B05B 15/68; B05B 13/0278
See application file for complete search history.

(56) References Cited

U.S. PATENT DOCUMENTS

2003/0081193 A1\* 5/2003 White ................. G03F 7/70633
355/72
2011/0074064 A1\* 3/2011 Hayashi ................. B82Y 10/00
264/293
(Continued)

FOREIGN PATENT DOCUMENTS

JP 2009536591 A 10/2009
JP 2013098291 A 5/2013
(Continued)

OTHER PUBLICATIONS

Office Action issued in Japanese Application No. 2018-000771 dated Sep. 17, 2021.
(Continued)

*Primary Examiner* — Jacob T Minskey
*Assistant Examiner* — Caroline Beha
(74) *Attorney, Agent, or Firm* — Rossi, Kimms & McDowell LLP

(57) ABSTRACT

Imprint apparatus forms pattern in shot regions of substrate by bringing pattern region of mold into contact with imprint material and curing the imprint material. The apparatus includes deformation mechanism which is for deforming the pattern region and includes actuator for applying force to the mold. For each shot region, after first processing of applying first deformation amount to the mold by the actuator is executed, second processing of curing the imprint material is executed in state in which the imprint material and the pattern region are in contact with each other and second deformation amount is applied to the mold by the actuator to reduce overlay error between the shot region and the pattern region. Magnitude relationship between the first deformation amount and the second deformation amount is same in the shot regions.

11 Claims, 13 Drawing Sheets

(56) References Cited

U.S. PATENT DOCUMENTS

| | | | | |
|---|---|---|---|---|
| 2012/0007279 A1* | 1/2012 | Torii | ................... | B29C 33/303 |
| | | | | 264/293 |
| 2013/0093113 A1* | 4/2013 | Hayashi | ................ | B29C 43/021 |
| | | | | 264/293 |
| 2014/0367874 A1* | 12/2014 | Yamamoto | ............ | G03F 7/0002 |
| | | | | 264/40.1 |
| 2016/0077451 A1* | 3/2016 | Nakagawa | ............ | G03F 7/0002 |
| | | | | 425/150 |
| 2016/0320697 A1* | 11/2016 | Asano | ................... | B29C 59/002 |
| 2016/0354969 A1* | 12/2016 | Baba | ..................... | G03F 7/0002 |

FOREIGN PATENT DOCUMENTS

| | | | |
|---|---|---|---|
| JP | 2013125817 A | 6/2013 | |
| JP | 2014110368 A | 6/2014 | |
| JP | 2016192543 A | 11/2016 | |
| JP | 2017123493 A | 7/2017 | |
| KR | 1020160033038 A | 3/2016 | |
| KR | 1020160121433 A | 10/2016 | |

OTHER PUBLICATIONS

Office Action issued in Korean Appln. No. 10-2019-0000592 dated Jan. 27, 2022.

* cited by examiner

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus brings the pattern region of a mold into contact with an imprint material arranged in a shot region of a substrate and cures the imprint material, forming a pattern from the cured product of the imprint material in the shot region of the substrate. The imprint apparatus can include a deformation mechanism configured to deform the pattern region of a mold by applying a force to the side surface of the mold in order to reduce an overlay error between the shot region and the pattern region of the mold (see Japanese Patent Laid-Open No. 2013-125817).

A plurality of shot regions are arranged on a substrate and their shapes (including sizes) can differ from each other. The deformation amount of the pattern region of the mold by the deformation mechanism can be different between the shot regions.

SUMMARY OF THE INVENTION

The present inventor has found that a hysteresis exists between a force applied to the mold and the deformation amount of the pattern region of the mold. This hysteresis is a phenomenon that depends on a force applied in the past as well as a force currently applied to the mold. The presence of the hysteresis can generate a corresponding overlay error in sequentially performing imprinting in a plurality of shot regions while changing the shape of the pattern region of the mold in accordance with the shape of an imprint target shot region. That is, if the hysteresis exists, the overlay precision between the shot region and the pattern region of the mold can decrease.

The present invention provides a technique advantageous in improving the overlay precision between the shot region of a substrate and the pattern region of a mold.

One of aspects of the present invention provides an imprint apparatus that forms a pattern in a plurality of shot regions of a substrate by bringing a pattern region of a mold into contact with an imprint material and curing the imprint material, the apparatus comprising: a deformation mechanism configured to deform the pattern region, the deformation mechanism including an actuator configured to apply a force to the mold, wherein, for each shot region, after first processing of applying a first deformation amount to the mold by the actuator is executed, second processing of curing the imprint material is executed in a state in which the imprint material and the pattern region are in contact with each other and a second deformation amount is applied to the mold by the actuator to reduce an overlay error between the shot region and the pattern region, and a magnitude relationship between the first deformation amount and the second deformation amount is same in the plurality of shot regions.

Further features of the present invention will become apparent from the following description of exemplary embodiments with reference to the attached drawings.

DESCRIPTION OF THE EMBODIMENTS

The present invention will now be described through exemplary embodiments with reference to the accompanying drawings.

Figure 1:
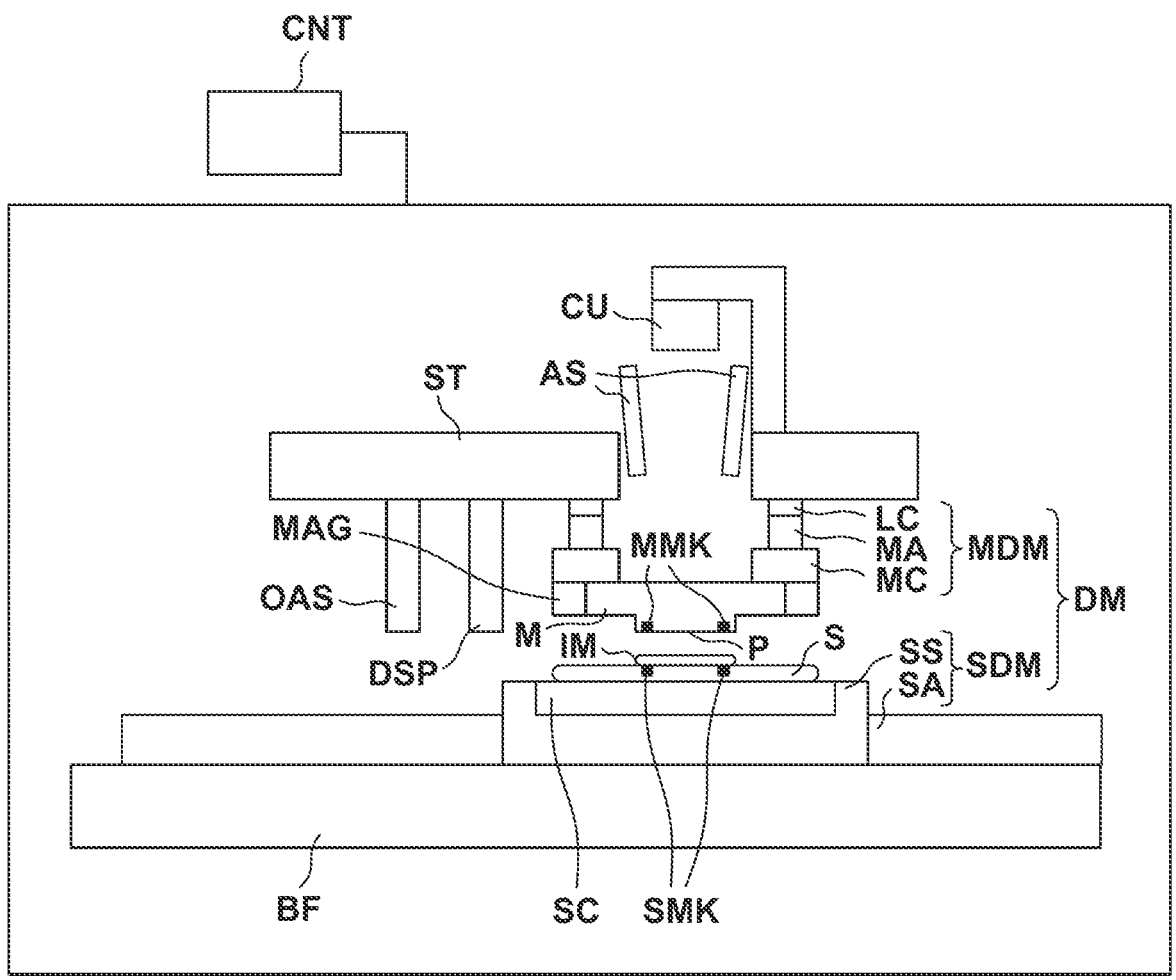
FIG. 1 is a view showing the arrangement of an imprint apparatus according to an embodiment of the present invention.

FIG. 1 shows the arrangement of an imprint apparatus 100 according to an embodiment of the present invention. The imprint apparatus 100 is configured to form a pattern from a cured product of an imprint material IM on a substrate S by imprint processing. The imprint processing can include contact processing, alignment processing, curing processing, and separation processing. The contact processing is processing of bringing a pattern region P pf a mold M into contact with an imprint material IM in a shot region of the substrate S. The alignment processing is processing of performing alignment between the shot region of the substrate S and the pattern region P of the mold M. The alignment processing in the imprint processing sometimes includes deformation processing of deforming the pattern region P of the mold M so as to reduce an overlay error between the shot region of the substrate S and the pattern region P of the mold M. The curing processing is processing of curing the imprint material IM. The separation processing is processing of separating the pattern formed from the cured product of the imprint material IM from the pattern region P of the mold M.

A curable composition (to be sometimes referred to as an uncured resin hereinafter) that is cured by receiving curing energy is used as the imprint material. An electromagnetic wave, heat, or the like can be used as the curing energy. The electromagnetic wave can be, for example, light such as infrared light, visible light, or ultraviolet light whose wavelength is selected within a range of 10 nm (inclusive) to 1 mm (inclusive). The curable composition can be a composition that is cured by light irradiation or application of heat. Out of these compositions, a photo-curable composition that is cured by light irradiation contains at least a polymerizable compound and a photopolymerization initiator, and may further contain a non-polymerizable compound or solvent, as needed. The non-polymerizable compound is at least a material selected from the group consisting of a sensitizer, a hydrogen donor, an internal mold release agent, a surfactant, an antioxidant, a polymer component, and the like. The imprint material can be arranged on the substrate in a droplet-like shape, or an island-like shape or a film-like shape formed by a plurality of droplets connected to each other. The viscosity (viscosity at 25° C.) of the imprint material can fall within, for example, a range of 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

In this specification and the accompanying drawings, directions are shown in an X-Y-Z coordinate system in which a direction parallel to the surface of the substrate S forms an X-Y plane. Let X, Y, and Z directions be directions parallel to X-, Y-, and Z-axes in the X-Y-Z coordinate system, respectively. Let $\theta X$, $\theta Y$, and $\theta Z$ be rotation about the X-axis, rotation about the Y-axis, and rotation about the Z-axis, respectively. Control or driving operations with respect to the X-, Y-, and Z-axes indicate control or driving operations with respect to the directions parallel to the X-, Y-, and Z-axes, respectively. Furthermore, control or driving operations with respect to $\theta X$-, $\theta Y$-, and $\theta Z$-axes indicate control or driving operations with respect to rotation about an axis parallel to the X-axis, rotation about an axis parallel to the Y-axis, and rotation about an axis parallel to the Z-axis, respectively. A position is information that can be specified based on coordinates on the X-, Y-, and Z-axes. An orientation is information that can be specified by values on the $\theta X$-, $\theta Y$-, and $\theta Z$-axes. Positioning indicates control of the position and/or orientation. Alignment (alignment processing) can include control of the position and/or orientation of at least one of the substrate and the mold.

The imprint apparatus 100 can include a substrate drive mechanism SDM that holds and drives the substrate S, a base frame BF that supports the substrate drive mechanism SDM, a mold drive mechanism MDM that holds and drives the mold M, and a structure ST that supports the mold drive mechanism MDM. The substrate drive mechanism SDM can include a substrate stage SS including a substrate chuck SC that holds the substrate S, and a substrate positioning mechanism SA that positions the substrate S by positioning the substrate stage SS. The mold drive mechanism MDM includes a mold chuck MC that holds the mold M, and a mold positioning mechanism MA that positions the mold M by positioning the mold chuck MC. The mold drive mechanism MDM may include a load cell LC that detects a force applied to the mold Min in the contact step and/or the separation step. The mold drive mechanism MDM can further include a pressure mechanism that applies a pressure to a surface opposite to the pattern region P to deform the pattern region P of the mold M so that the pattern region P of the mold M has a convex shape toward the substrate S in contact processing.

The substrate drive mechanism SDM and the mold drive mechanism MDM constitute a drive mechanism DM that drives at least one of the substrate S and the mold M to change the relative positions of the substrate S and mold M. The change of the relative positions by the drive mechanism DM includes drive for contact of the pattern region P of the mold M to the imprint material on the substrate S and separation of the mold M from the cured imprint material (a pattern of the cured product). In other words, the change of the relative positions by the drive mechanism DM includes a change of the relative positions of the substrate S and mold M to perform contact processing and separation processing. The substrate drive mechanism SDM can be configured to drive the substrate S about a plurality of axes (for example, three, X-, Y-, and $\theta Z$-axes, preferably six, X-, Y-, Z-, $\theta X$-, $\theta Y$-, and $\theta Z$-axes). The mold drive mechanism MDM can be configured to drive the mold M about a plurality of axes (for example, three, Z-, $\theta X$-, and $\theta Y$-axes, preferably six, X-, Y-, Z-, $\theta X$-, $\theta Y$-, and $\theta Z$-axes).

The imprint apparatus 100 can further include a deformation mechanism MAG that deforms the pattern region P of the mold M. The deformation mechanism MAG can deform the pattern region P to change the shape (including the size) of the pattern region P within a plane parallel to the X-Y plane. The deformation mechanism MAG can deform the pattern region P by, for example, applying force to four side surfaces of the mold M.

The imprint apparatus 100 can further include a dispenser DSP. The dispenser DSP may be configured as an external device of the imprint apparatus 100. The dispenser DSP arranges the imprint material IM in a shot region of the substrate S. The arrangement of the imprint material IM in a shot region of the substrate S can be achieved by driving the substrate S by the substrate drive mechanism SDM and in this state discharging the imprint material IM from the dispenser DSP in synchronization with the drive. Contact processing, alignment processing, curing processing, and separation processing can be executed every time the dispenser DSP arranges the imprint material IM in one shot region on the substrate S. It is also possible to arrange the imprint material IM in a plurality of shot regions on the substrate S by the dispenser DSP and then execute contact processing, alignment processing, curing processing, and separation processing in each of the plurality of shot regions.

The imprint apparatus 100 can further include a curing unit CU. The curing unit CU cures the imprint material IM by irradiating the imprint material IM with curing energy in a state in which the pattern region P of the mold M is in contact with the imprint material IM on the substrate S. As a result, a pattern made of a cured product of the imprint material IM is formed on the substrate S.

The imprint apparatus 100 can further include an alignment scope (measurement device) AS that detects (measures) the positions of marks SMK of shot regions of the substrate S, the positions of marks MMK of the mold M, the relative positions of the marks SMK of the shot regions of the substrate S and positions of the marks MMK of the mold M, and the like. The imprint apparatus 100 can further include an off-axis scope OAS that detects (measures) the positions of the marks SMK of the shot regions of the substrate S.

The imprint apparatus 100 can further include a controller CNT. The controller CNT can control the drive mechanism DM, the deformation mechanism MAG, the dispenser DSP, the curing unit CU, the alignment scope AS, and the off-axis scope OAS. The controller CNT can be constituted by a PLD (Programmable Logic Device) such as an FPGA (Field Programmable Gate Array), an ASIC (Application Specific Integrated Circuit), a program-installed general-purpose computer, or a combination of all or some of them.

The controller CNT can calculate the shape of a shot region based on a result detected by the alignment scope AS such as the position of the mark SMK of the shot region of the substrate S. The controller CNT can also calculate the shape of the pattern region P of the mold M based on a result detected by the alignment scope AS such as the position of the mark MMK of the mold M. The controller CNT can calculate an overlay error between the shot region of the substrate S and the pattern region P of the mold M based on the obtained shapes of the shot region and pattern region P. Alternatively, the controller CNT can calculate an overlay error between the shot region of the substrate S and the pattern region P of the mold M based on a result detected by the alignment scope AS such as the relative position of the mark SMK of the substrate S and that of the mark MMK of the mold M. In other words, based on the output of the alignment scope AS, the controller CNT can calculate an overlay error (a difference between the shape of the shot region and that of the pattern region) between the shot region of the substrate S and the pattern region P of the mold M. The overlay error can include, for example, a magnification component and a distortion component (for example, a component of a rhombus, a trapezoid, or the like, or a higher-order component).

Figure 2:
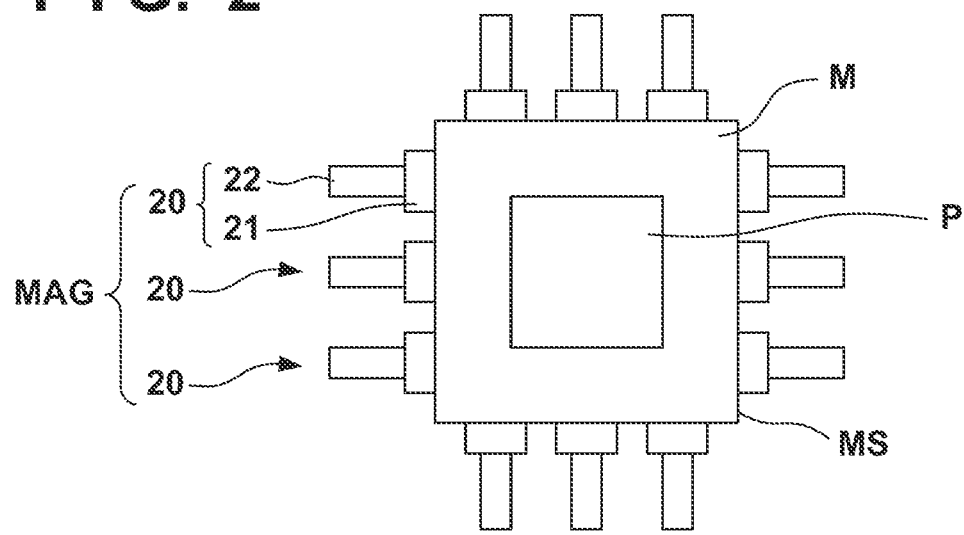
FIG. 2 is a view showing an example of the arrangement of a deformation mechanism.

FIG. 2 shows an example of the arrangement of the deformation mechanism MAG. The deformation mechanism MAG can deform the pattern region P of the mold M by applying a force to four side surfaces MS of the mold M. The component of the shape (including the size) of the pattern region P controllable by the deformation mechanism MAG can include, for example, a magnification component and a distortion component (for example, a component of a rhombus, a trapezoid, or the like, or a higher-order component). The deformation mechanism MAG can include a plurality of units 20. Each unit 20 can include a contact portion 21 that comes into contact with the side surface MS of the mold M, and an actuator 22 that drives the contact portion 21. The actuator 22 can include, for example, a piezoelectric element but may include another element.

Figure 3:
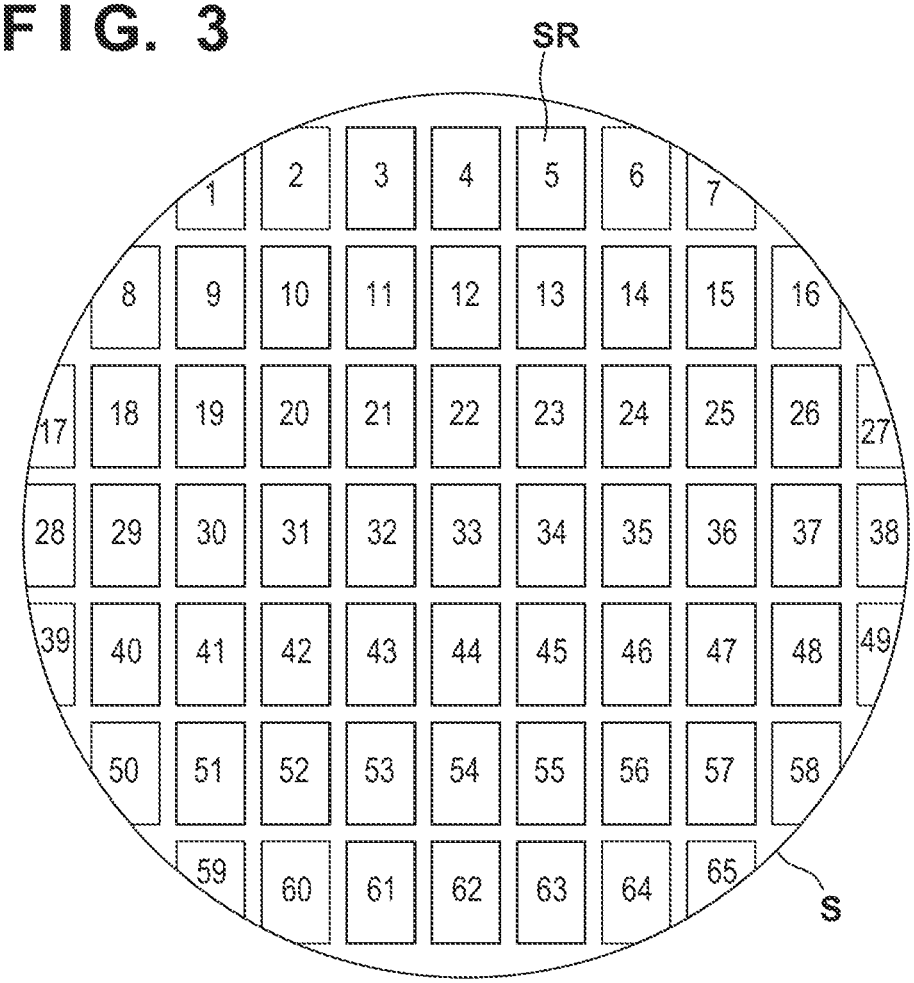
FIG. 3 is a view showing an example of the array of a plurality of shot regions on a substrate.

FIG. 3 shows an example of the array of a plurality of shot regions SR on the substrate S. Each number in FIG. 3 is a number (shot number) given to discriminate the plurality of shot regions SR from each other. Imprint processing in the plurality of shot regions SR can be executed in a predetermined order.

Substrate processing of executing imprint processing in each of a plurality of shot regions of the substrate S will be explained with reference to FIGS. 4 to 13. In FIGS. 4 to 13, a "deformation amount" can be a deformation amount given to the pattern region P of the mold M by the actuator 22 of one unit 20 of the deformation mechanism MAG. The shape (including the size) of the pattern region P of the mold M can be determined by composition of forces applied to the mold M by the actuators 22 of the units 20 of the deformation mechanism MAG. The controller CNT gives, to the actuators 22 of the units 20 of the deformation mechanism MAG, a command value for controlling the shape of the pattern region P of the mold M.

In FIGS. 4 to 13, the (i−1)th, ith, and (i+1)th shot regions are shot regions of the substrate S and undergo imprint processing in the order given. A "target deformation amount" is a command value (or a manipulated variable corresponding to the command value) given by the controller CNT to the actuator 22 of one unit 20 of the deformation mechanism MAG. Preparation processing (first processing) is processing of making preparations for the next imprint processing after the end of imprint processing in a given shot region. The preparation processing can, for example, include processing of arranging the imprint material IM by the dispenser DSP in a shot region to undergo imprint processing next, and processing of arranging under the mold M the shot region to undergo imprint processing next. The processes shown in FIGS. 4 to 13 is controlled by the controller CNT.

In the imprint apparatus 100, for each shot region, the second processing (curing processing) is executed after the first processing (preparation processing) is executed. In the first processing, the actuator 22 gives the first deformation amount to the mold M. In the second processing, the imprint material is cured in a state in which the imprint material in the shot region and the pattern region P are in contact each other and each actuator 22 gives the second deformation amount to the mold M so as to reduce an overlay error between the shot region and the pattern region P. The first processing is executed in part of preparation processing and the second processing (curing processing) is executed in part of imprint processing.

In FIGS. 4 to 13, a target deformation amount for the ith shot region is larger than that for the (i−1)th shot region, and a target deformation amount for the (i+1)th shot region is smaller than that for the ith shot region.

Figure 4:
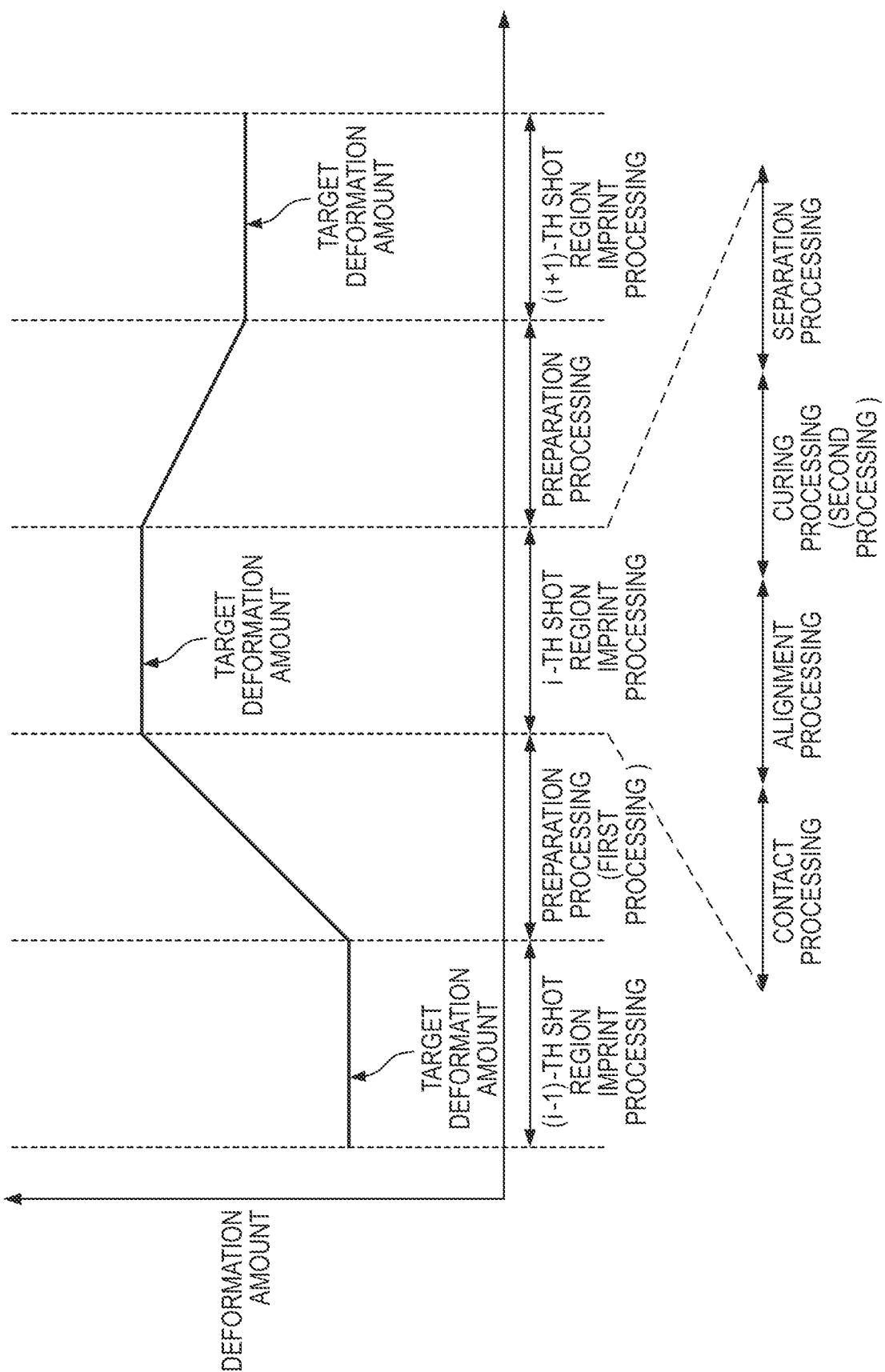
FIG. 4 is a view showing Comparative Example 1.

FIG. 4 shows Comparative Example 1. In Comparative Example 1, a target deformation amount for each shot region is determined before execution of imprint processing. In Comparative Example 1, the target deformation amount is changed from one for the (i−1)th shot region to one for the ith shot region in preparation processing for the ith shot region. The preparation processing for the ith shot region is executed in a period between imprint processing in the (i−1)th shot region and imprint processing in the ith shot region. In Comparative Example 1, the target deformation amount is changed from one for the ith shot region to one for the (i+1)th shot region in preparation processing for the (i+1)th shot region. The preparation processing for the (i+1)th shot region is executed in a period between imprint processing in the ith shot region and imprint processing in the (i+1)th shot region.

In Comparative Example 1, the magnitude relationship between a deformation amount (first deformation amount) given to the pattern region P of the mold M in the first processing during preparation processing and a deformation amount (second deformation amount) given to the pattern region P of the mold M in the second processing (curing processing) during imprint processing is not constant or is not the same. More specifically, a deformation amount (first deformation amount) given to the pattern region P in the first processing during preparation processing is larger than a deformation amount (second deformation amount) given to the pattern region P in the second processing (curing processing) during imprint processing in some cases and smaller in other cases. A deformation amount actually given to the pattern region P can differ between a case in which a deformation amount given to the pattern region P by the actuator 22 is increased toward a target deformation amount and a case in which the deformation amount is decreased toward the target deformation amount. That is, a hysteresis exists between a force applied to the mold M and the deformation amount of the pattern region P of the mold M. The hysteresis can, for example, be generated by the friction between the mold M and the mold chuck MC, the mechanical characteristics of the mold M, the mechanical characteristics (the hysteresis of the actuator and contact portion) of the deformation mechanism MAG, and the like.

The presence of the hysteresis makes it difficult to deform the pattern region P of the mold M by a deformation amount faithful to the target deformation amount. Hence, the presence of the hysteresis makes it hard to control the shot region of the substrate S to a target shape and reduce an overlay error between the shot region of the substrate S and the pattern region P of the mold M.

Figure 5:
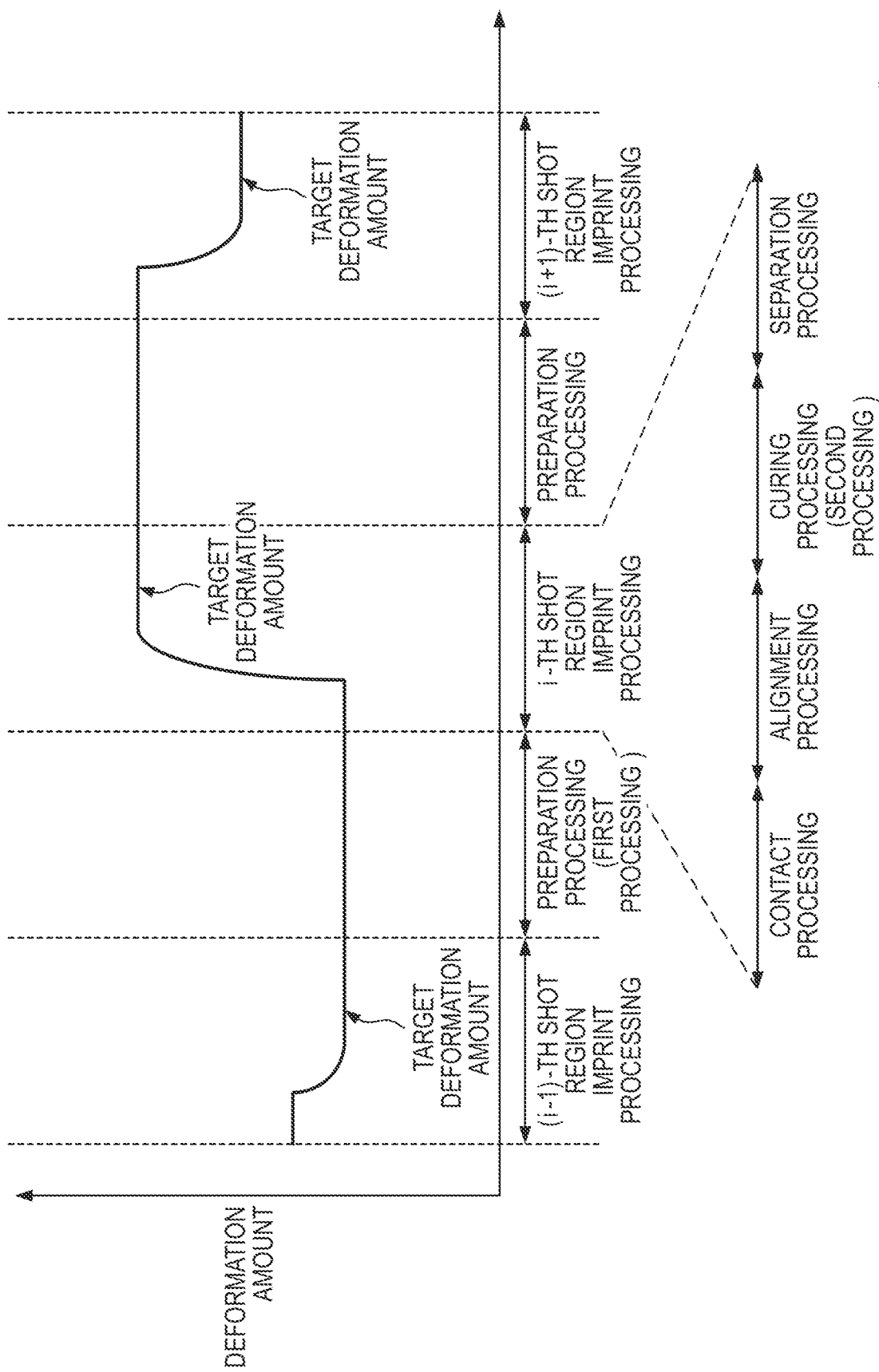
FIG. 5 is a view showing Comparative Example 2.

FIG. 5 shows Comparative Example 2. In Comparative Example 2, an overlay error is measured using the alignment scope AS in alignment processing during imprint processing in each shot region, and the controller CNT determines a target drive amount based on this measurement. That is, in Comparative Example 2, the target deformation amount is changed from one for the (i−1)th shot region to one for the ith shot region in alignment processing during imprint processing in the ith shot region. In Comparative Example 2, the target deformation amount is changed from one for the ith shot region to one for the (i+1)th shot region in alignment processing during imprint processing in the (i+1)th shot region.

Even in Comparative Example 2, the magnitude relationship between a deformation amount (first deformation amount) given to the pattern region P of the mold M in the first processing during preparation processing and a deformation amount (second deformation amount) given to the pattern region P of the mold M in the second processing (curing processing) during imprint processing is not constant. More specifically, a deformation amount (first deformation amount) given to the pattern region P in the first processing during preparation processing is larger than a deformation amount (second deformation amount) given to the pattern region P in the second processing (curing processing) during imprint processing in some cases and smaller in other cases. The hysteresis problem arises even in Comparative Example 2 and it is difficult to reduce an overlay error between the shot region of the substrate S and the pattern region P of the mold M.

The first to eighth embodiments advantageous in reducing the influence of the hysteresis (worsening of the overlay error) will be explained with reference to FIGS. 6 to 13. In the following embodiments, the magnitude relationship between the first deformation amount given to the pattern region P in the first processing during preparation processing and the second deformation amount given to the pattern region P in the second processing (curing processing) during imprint processing is constant or the same in a plurality of shot regions. This reduces the influence of the hysteresis (worsening of the overlay error).

Figure 6:
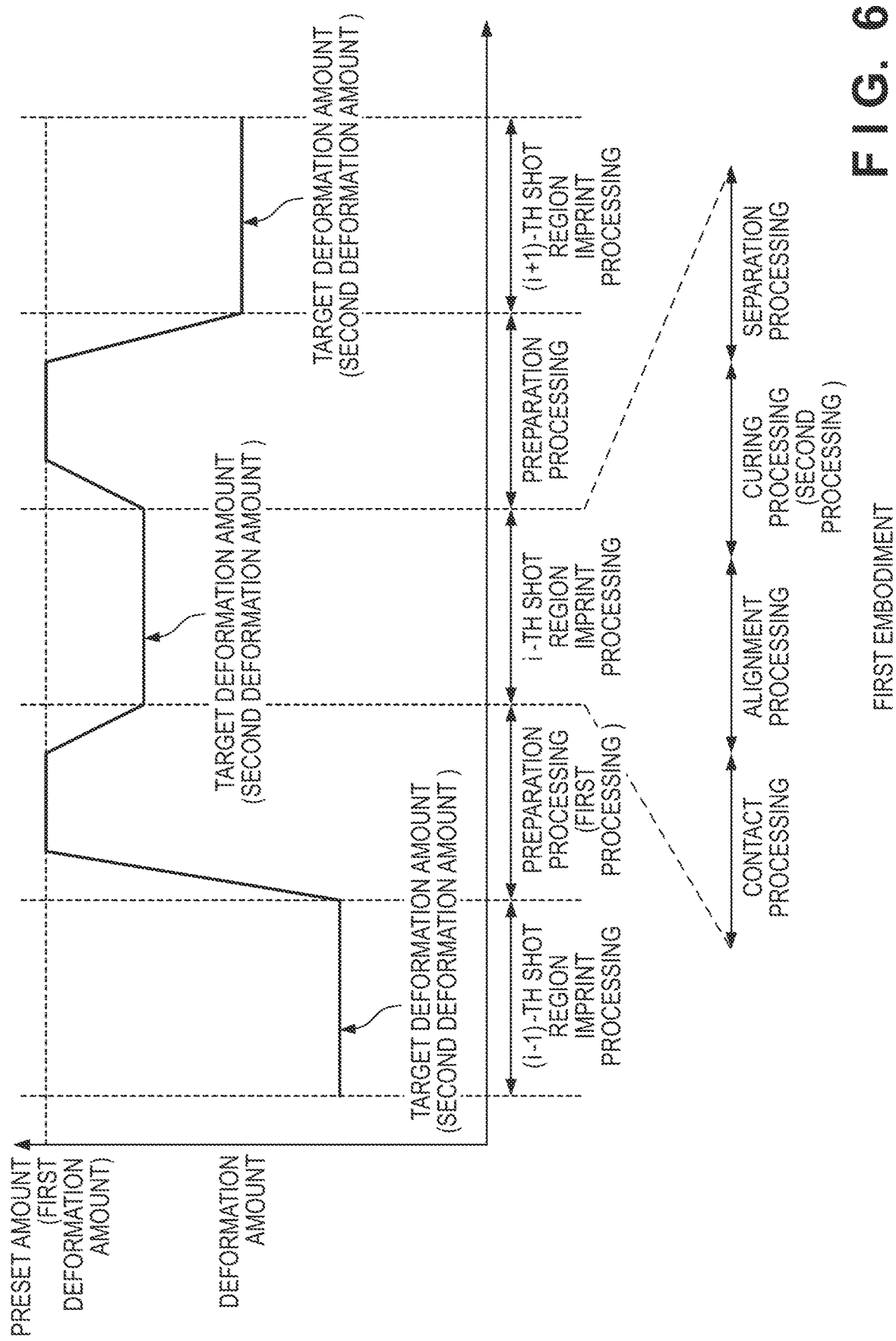
FIG. 6 is a view showing the first embodiment.

FIG. 6 shows the first embodiment. In the first embodiment, a target deformation amount for each of a plurality of shot regions is determined based on shape information of the shot regions acquired in advance before execution of imprint processing. The shape information can be determined by, for example, detecting the position of a mark SMK of each shot region of a substrate S by an alignment scope AS. As the shape information, for example, a result of measurement by an external measurement device in advance before execution of imprint processing may be used. Further, a result of measuring a result of imprint processing by an external measurement device can be used as the shape information. In the first embodiment, the first deformation amount given to a pattern region P of a mold M by an actuator 22 in the first processing is set to be larger than the maximum value of the second deformation amount given to the pattern region P of the mold M in the second processing (curing processing) for the plurality of shot regions. In other words, in the first embodiment, the first deformation amount is a constant preset amount and the preset amount is set to be larger than the maximum value of the second deformation amount given to the pattern region P of the mold M in the second processing (curing processing) for the plurality of shot regions.

The maximum value of the second deformation amount given to the pattern region P of the mold M in the second processing (curing processing) for the plurality of shot regions can be determined based on processing results in the past (for example, a previous lot, a previous substrate, or a lot using the same type of mold) or the like. The first deformation amount (preset amount) can be determined by adding a margin to the maximum value.

The magnitude relationship between the first deformation amount given to the pattern region P in the first processing during preparation processing and the second deformation amount given to the pattern region P in the second processing (curing processing) during imprint processing becomes constant in a plurality of shot regions. Thus, a deformation amount (first deformation amount) given to the pattern region P in the first processing during preparation processing always becomes larger than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

Figure 7:
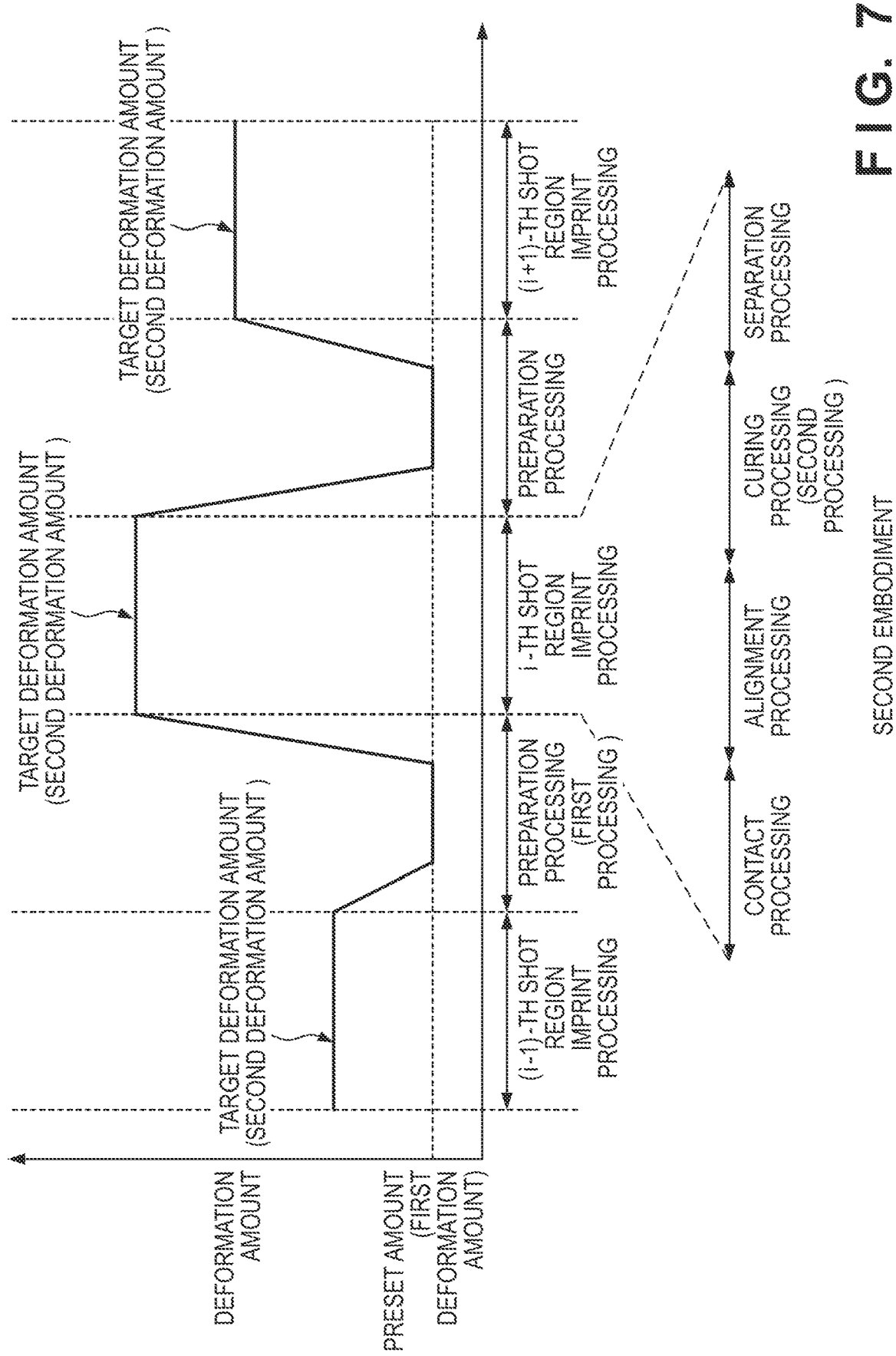
FIG. 7 is a view showing the second embodiment.

FIG. 7 shows the second embodiment. In the second embodiment, a target deformation amount for each of a plurality of shot regions is determined based on shape information of the shot regions acquired in advance before execution of imprint processing. The shape information can be acquired by, for example, detecting the position of a mark SMK of each shot region of a substrate S by an alignment scope AS. In the second embodiment, the first deformation amount given to a pattern region P of a mold M by an actuator 22 in the first processing is set to be smaller than the minimum value of the second deformation amount given to the pattern region P of the mold M in the second processing (curing processing) for the plurality of shot regions. In other words, in the second embodiment, the first deformation amount is a constant preset amount and the preset amount is set to be smaller than the minimum value of the second deformation amount given to the pattern region P of the mold M in the second processing (curing processing) for the plurality of shot regions.

The magnitude relationship between the first deformation amount given to the pattern region P in the first processing during preparation processing and the second deformation amount given to the pattern region P in the second processing (curing processing) during imprint processing becomes constant in a plurality of shot regions. A deformation amount (first deformation amount) given to the pattern region P in the first processing during preparation processing always becomes smaller than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

The minimum value of the second deformation amount given to the pattern region P of the mold M in the second processing (curing processing) for the plurality of shot regions can be determined based on processing results in the past (for example, a previous lot, a previous substrate, or a lot using the same type of mold) or the like. The first deformation amount (preset amount) can be determined by subtracting a margin from the minimum value.

Figure 8:
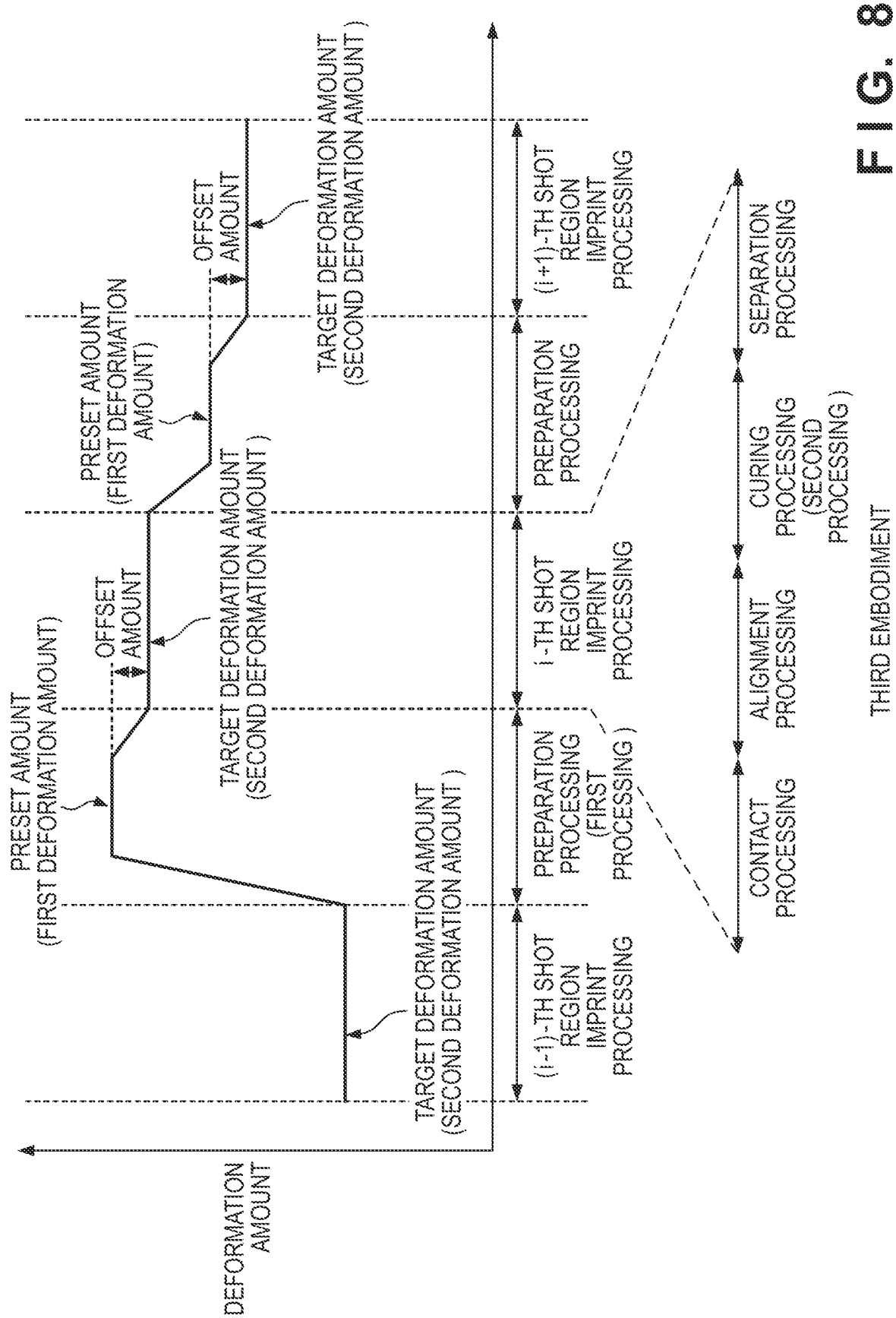
FIG. 8 is a view showing the third embodiment.

FIG. 8 shows the third embodiment. In the third embodiment, a target deformation amount for each of a plurality of shot regions is determined based on shape information of the shot regions acquired in advance before execution of imprint processing. The shape information can be acquired by, for example, detecting the position of a mark SMK of each shot region of a substrate S by an alignment scope AS. In the third embodiment, the difference between the first deformation amount given to a pattern region P of a mold M by an actuator 22 in the first processing and the second deformation amount given to the pattern region P of the mold M in the second processing (curing processing) subsequent to the first processing is set to be a predetermined positive value in a plurality of shot regions. In other words, in the third embodiment, the difference is set to be a predetermined positive offset value.

The magnitude relationship between the first deformation amount given to the pattern region P in the first processing during preparation processing and the second deformation amount given to the pattern region P in the second processing (curing processing) during imprint processing becomes constant in a plurality of shot regions. A deformation amount (first deformation amount) given to the pattern region P in the first processing during preparation processing always becomes larger than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

Figure 9:
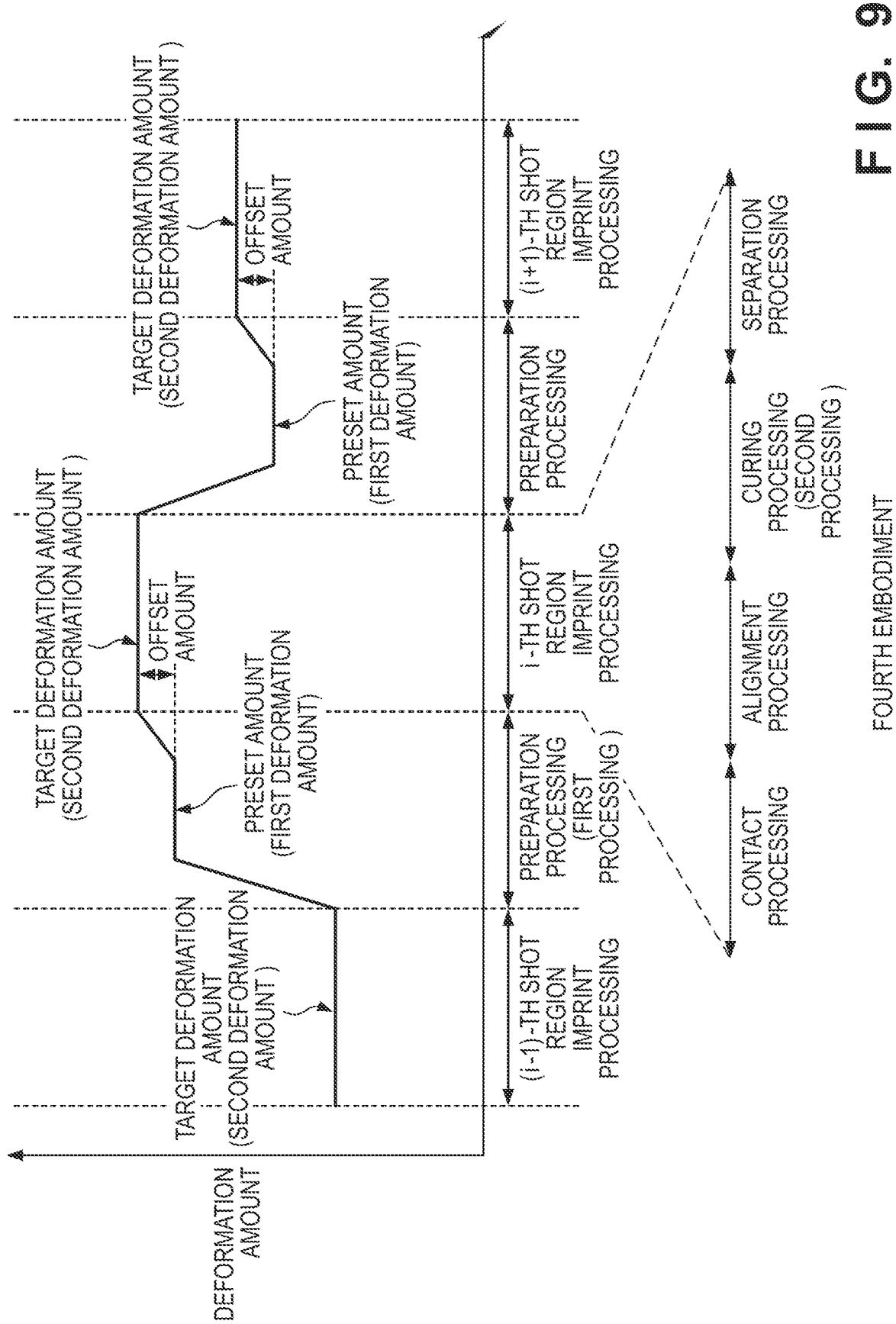
FIG. 9 is a view showing the fourth embodiment.

FIG. 9 shows the fourth embodiment. In the fourth embodiment, a target deformation amount for each of a plurality of shot regions is determined based on shape information of the shot regions acquired in advance before execution of imprint processing. The shape information can be acquired by, for example, detecting the position of a mark SMK of each shot region of a substrate S by an alignment scope AS. In the fourth embodiment, the difference between the first deformation amount given to a pattern region P of a mold M by an actuator 22 in the first processing and the second deformation amount given to the pattern region P of the mold M in the second processing (curing processing) subsequent to the first processing is set to be a predetermined negative value in a plurality of shot regions. In other words, in the fourth embodiment, the difference is set to be a predetermined negative offset value.

The magnitude relationship between the first deformation amount given to the pattern region P in the first processing during preparation processing and the second deformation amount given to the pattern region P in the second processing (curing processing) during imprint processing becomes constant in a plurality of shot regions. A deformation amount (first deformation amount) given to the pattern region P in the first processing during preparation processing always becomes smaller than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

Figure 10:
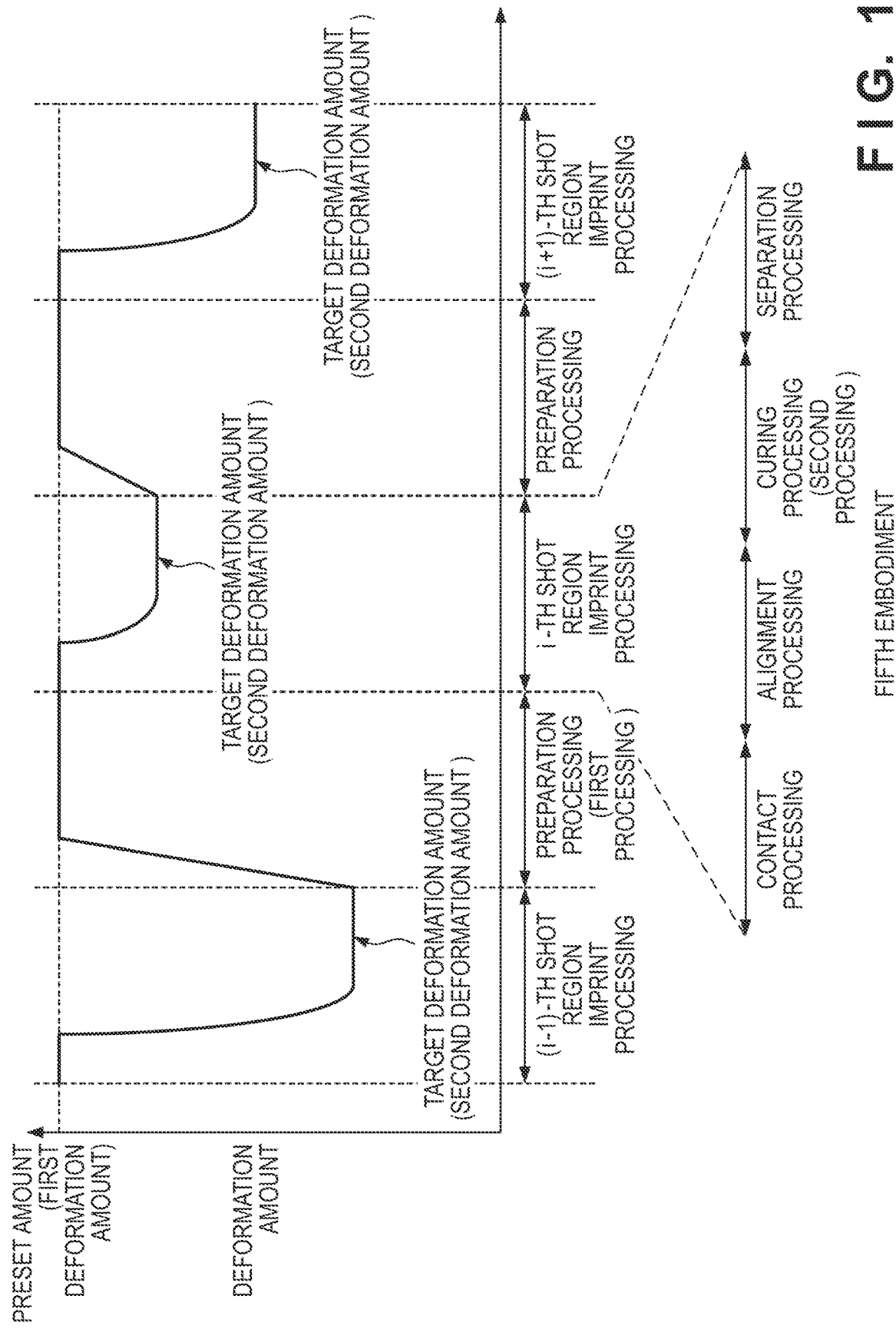
FIG. 10 is a view showing the fifth embodiment.

FIG. 10 shows the fifth embodiment. In the fifth embodiment, an overlay error is measured using an alignment scope AS in alignment processing during imprint processing for each shot region, and a controller CNT determines a target drive amount based on this measurement. In preparation processing (first processing) between imprint processing and imprint processing, the first deformation amount serving as a deformation amount for a pattern region P of a mold M is set to be a constant preset amount. That is, in the fifth embodiment, the target deformation amount is changed from a preset amount (first deformation amount) to a target deformation amount (second deformation amount) for the ith shot region in alignment processing during imprint processing for the ith shot region. Also, in the fifth embodiment, the target deformation amount is changed from a preset amount (first deformation amount) to a target deformation amount (second deformation amount) for the (i+1)th shot region in alignment processing during imprint processing for the (i+1)th shot region.

In the fifth embodiment, the first deformation amount (preset amount) given to the pattern region P by an actuator 22 in the first processing is set to be larger than the maximum value of the second deformation amount given to the pattern region P in the second processing (curing processing) for a plurality of shot regions. In other words, in the fifth embodiment, the first deformation amount is set to be a constant preset amount and is set to be larger than the maximum value of the second deformation amount given to the pattern region P of the mold M in the second processing (curing processing) for a plurality of shot regions.

The maximum value of the second deformation amount given to the pattern region P of the mold M in the second processing (curing processing) for the plurality of shot regions can be determined based on processing results in the past (for example, a previous lot, a previous substrate, or a lot using the same type of mold) or the like. The first deformation amount (preset amount) can be determined by adding a margin to the maximum value.

Even in the fifth embodiment, the magnitude relationship between the first deformation amount given to the pattern region P in the first processing during preparation processing and the second deformation amount given to the pattern region P in the second processing (curing processing) during imprint processing becomes constant in a plurality of shot regions. Therefore, a deformation amount (first deformation amount) given to the pattern region P in the first processing during preparation processing always becomes larger than a deformation amount (second deformation amount) given to the pattern region P in the second processing (curing processing) during imprint processing. The pattern region P of the mold M can be deformed by a more accurate deformation amount with respect to a target deformation amount. The shot region of a substrate S can be stably controlled to a target shape, and the overlay error between the shot region of the substrate S and the pattern region P of the mold M can be reduced.

Figure 11:
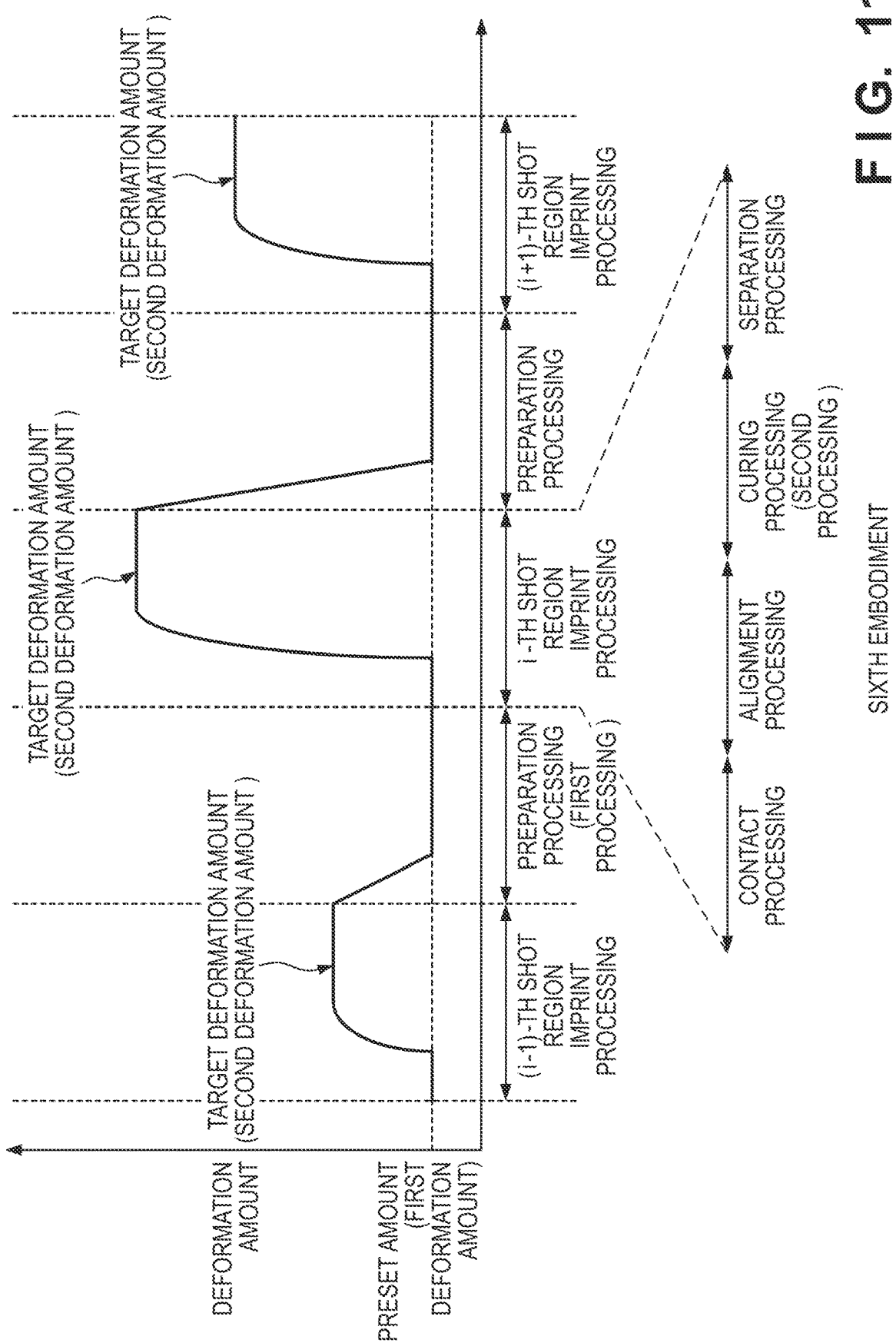
FIG. 11 is a view showing the sixth embodiment.

FIG. 11 shows the sixth embodiment. In the sixth embodiment, an overlay error is measured using an alignment scope AS in alignment processing during imprint processing for each shot region, and a controller CNT determines a target deformation amount based on this measurement. In preparation processing (first processing) between imprint processing and imprint processing, the first deformation amount serving as a deformation amount for a pattern region P of a mold M is set to be a constant preset amount. That is, in the sixth embodiment, the target deformation amount is changed from a preset amount (first deformation amount) to a target deformation amount (second deformation amount) for the ith shot region in alignment processing during imprint processing for the ith shot region. Also, in the sixth embodiment, the target deformation amount is changed from a preset amount (first deformation amount) to a target deformation amount (second deformation amount) for the (i+1)th shot region in alignment processing during imprint processing for the (i+1)th shot region.

In the sixth embodiment, the first deformation amount (preset amount) given to the pattern region P by an actuator 22 in the first processing is set to be smaller than the minimum value of the second deformation amount given to the pattern region P in the second processing (curing processing) for a plurality of shot regions. In other words, in the sixth embodiment, the first deformation amount is set to be a constant preset amount and is set to be smaller than the minimum value of the second deformation amount given to the pattern region P of the mold M in the second processing (curing processing) for a plurality of shot regions. The minimum value of the second deformation amount given to the pattern region P of the mold M in the second processing (curing processing) for the plurality of shot regions can be determined based on processing results in the past (for example, a previous lot, a previous substrate, or a lot using the same type of mold) or the like. The first deformation amount (preset amount) can be determined by subtracting a margin from the minimum value.

Even in the sixth embodiment, the magnitude relationship between the first deformation amount given to the pattern region P in the first processing during preparation processing and the second deformation amount given to the pattern region P in the second processing (curing processing) during imprint processing becomes constant in a plurality of shot regions. Thus, a deformation amount (first deformation amount) given to the pattern region P in the first processing during preparation processing always becomes smaller than a deformation amount (second deformation amount) given to the pattern region P in the second processing (curing processing) during imprint processing. The pattern region P of the mold M can be deformed by a more accurate deformation amount with respect to a target deformation amount. The shot region of a substrate S can be stably controlled to a target shape, and the overlay error between the shot region of the substrate S and the pattern region P of the mold M can be reduced.

Figure 12:
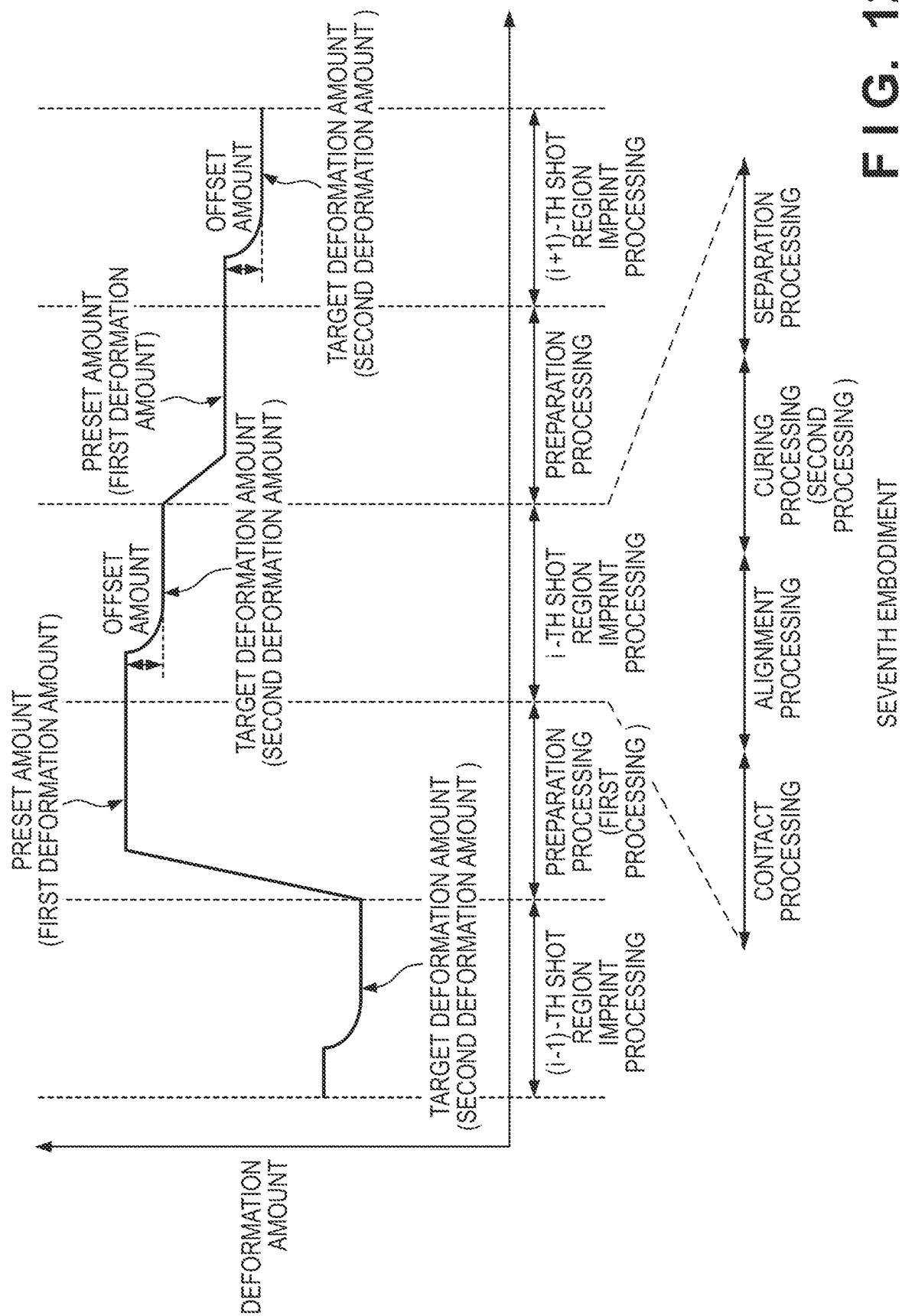
FIG. 12 is a view showing the seventh embodiment.

FIG. 12 shows the seventh embodiment. In the seventh embodiment, a temporary target deformation amount for each of a plurality of shot regions is determined based on shape information of the shot regions acquired in advance before execution of imprint processing. The shape information can be acquired based on processing results in the past (for example, a previous lot or a previous substrate) or the like. Alternatively, the shape information can be acquired by detecting the position of a mark SMK of each shot region of a substrate S by an alignment scope AS. In the seventh embodiment, the difference between the first deformation amount given to a pattern region P of a mold M by an actuator 22 in the first processing and a temporary target deformation amount given to the pattern region P of the mold M in the second processing (curing processing) subsequent to the first processing is set to be a predetermined positive value in a plurality of shot regions. In other words, in the seventh embodiment, the difference is set to be a predetermined positive offset value.

In the seventh embodiment, an overlay error is measured using the alignment scope AS in alignment processing during imprint processing for each shot region, and a controller CNT determines a target deformation amount based on this measurement.

Even in the seventh embodiment, the magnitude relationship between the first deformation amount given to the pattern region P in the first processing during preparation processing and the second deformation amount given to the pattern region P in the second processing (curing processing) during imprint processing becomes constant in a plurality of shot regions. A deformation amount (first deformation amount) given to the pattern region P in the first processing during preparation processing always becomes larger than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

Figure 13:
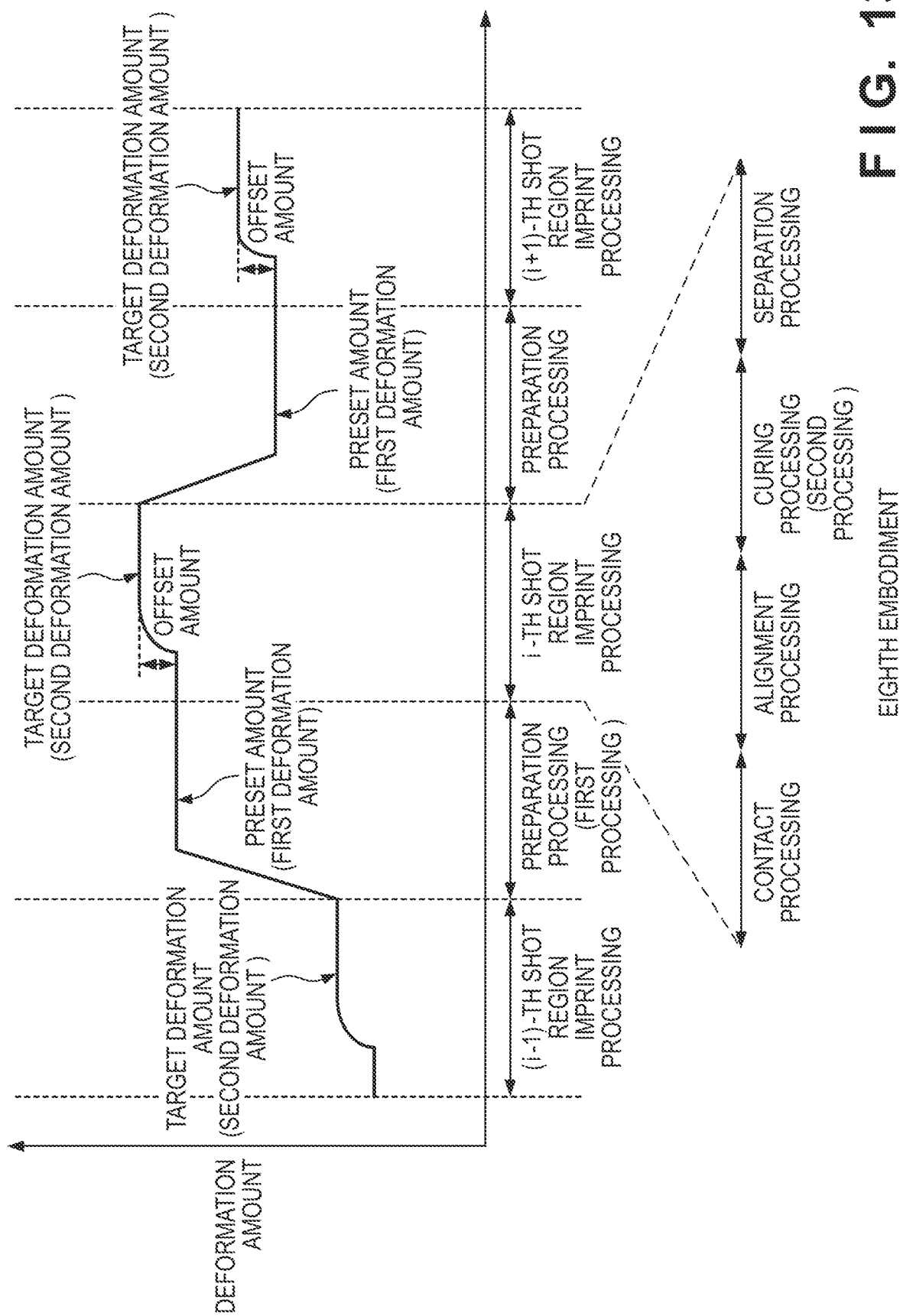
FIG. 13 is a view showing the eighth embodiment.

FIG. 13 shows the eighth embodiment. In the eighth embodiment, a temporary target deformation amount for each of a plurality of shot regions is determined based on shape information of the shot regions acquired in advance before execution of imprint processing. In the eighth embodiment, the difference between the first deformation amount given to a pattern region P of a mold M by an actuator 22 in the first processing and a temporary target deformation amount given to the pattern region P of the mold M in the second processing (curing processing) subsequent to the first processing is set to be a predetermined negative value in a plurality of shot regions. In other words, in the eighth embodiment, the difference is set to be a predetermined negative offset value.

In the eighth embodiment, an overlay error is measured using an alignment scope AS in alignment processing during imprint processing for each shot region, and a controller CNT determines a target deformation amount based on this measurement.

Even in the eighth embodiment, the magnitude relationship between the first deformation amount given to the pattern region P in the first processing during preparation processing and the second deformation amount given to the pattern region P in the second processing (curing processing) during imprint processing becomes constant in a plurality of shot regions. A deformation amount (first deformation amount) given to the pattern region P in the first processing during preparation processing always becomes smaller than a deformation amount (second deformation amount) given to the pattern region P in the second processing (curing processing) during imprint processing. The pattern region P of the mold M can be deformed by a more accurate deformation amount with respect to a target deformation amount. The shot region of the substrate S can be stably controlled to a target shape, and the overlay error between the shot region of the substrate S and the pattern region P of the mold M can be reduced.

A pattern of a cured product formed using the imprint apparatus is used permanently for at least some of various articles or used temporarily to manufacture various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of the cured product is used intact as a constituent member of at least some of the above-described articles or used temporarily as a resist mask. The resist mask is removed after etching, ion implantation, or the like is performed in a processing step of the substrate.

Figure 14A:
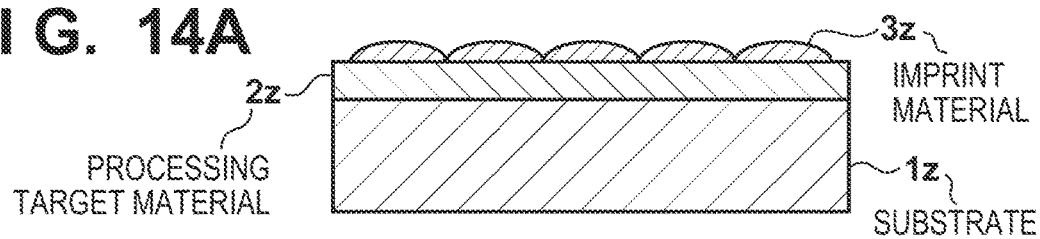
FIGS. 14A to 14F are views showing an article manufacturing method according to an embodiment.

An article manufacturing method of forming a pattern on a substrate by an imprint apparatus, processing the substrate on which the pattern has been formed, and manufacturing an article from the substrate on which the process has been performed will be described next. As shown in FIG. 14A, a substrate $1z$ such as a silicon wafer having a processing target material $2z$ such as an insulator formed on its surface is prepared, and then an imprint material $3z$ is applied onto the surface of the processing target material $2z$ by an inkjet method or the like. A state in which the imprint material $3z$ formed into a plurality of droplets is applied onto the substrate is shown here.

Figure 14B:
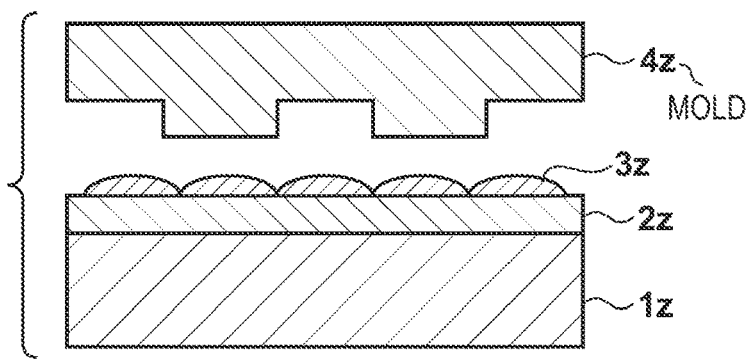
Figure 14C:
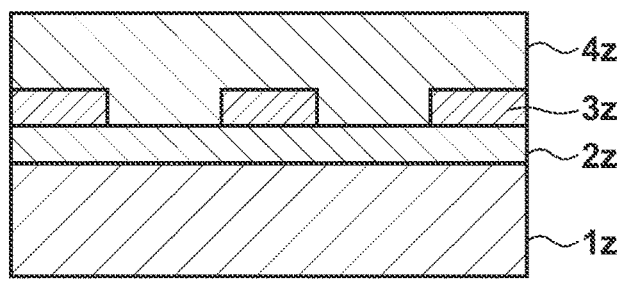

As shown in FIG. 14B, a side of an imprinting mold $4z$ on which its three-dimensional pattern is formed faces the imprint material $3z$ on the substrate. As shown in FIG. 14C, the mold $4z$ and the substrate $1z$ to which the imprint material $3z$ is applied are brought into contact with each other, and a pressure is applied. A gap between the mold $4z$ and the processing target material $2z$ is filled with the imprint material $3z$. When the imprint material $3z$ is irradiated with light as curing energy through the mold $4z$ in this state, the imprint material $3z$ is cured.

Figure 14D:
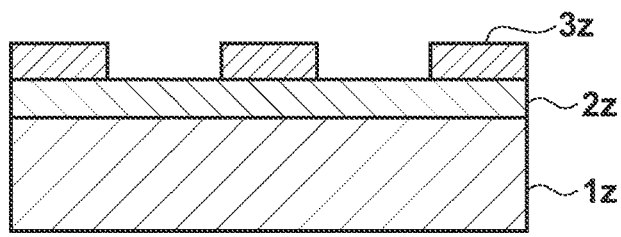

As shown in FIG. 14D, the pattern of the cured product of the imprint material $3z$ is formed on the substrate $1z$ by separating the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 14E:
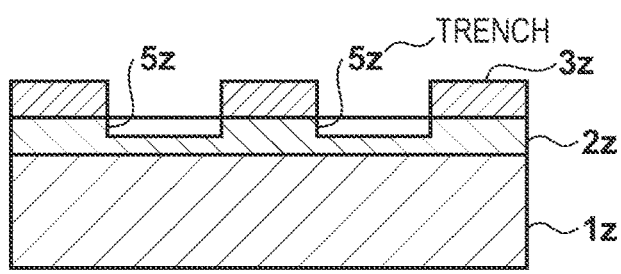
Figure 14F:
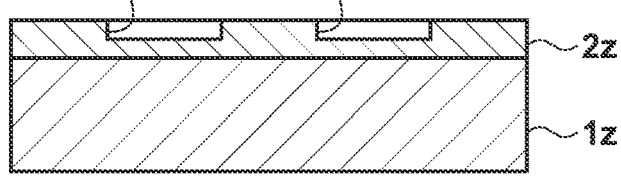

As shown in FIG. 14E, out of the surface of the processing target material $2z$, portions without any cured product or portions where the cured products remain thin are removed to form trenches $5z$ by performing etching using the pattern of the cured product as an etching resistant mask. As shown in FIG. 14F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-000771, filed Jan. 5, 2018, which is hereby incorporated by reference herein in its entirety.

What is claimed is:

1. An imprint apparatus that forms a pattern in a plurality of shot regions of a substrate by bringing a pattern region of a mold into contact with an imprint material and curing the imprint material, the apparatus comprising:
   a deformation mechanism configured to deform the pattern region, the deformation mechanism including an actuator configured to apply a force to a side surface of the mold,
   wherein, for each shot region, after first processing of applying a first deformation amount to the mold by applying the force to the side surface of the mold by the actuator is executed, second processing of curing the imprint material is executed in a state in which the imprint material and the pattern region are in contact with each other and a second deformation amount is applied to the mold during the second processing by applying the force to the side surface of the mold by the actuator to reduce an overlay error between the shot region and the pattern region while curing the imprint material, and
   wherein the first deformation amount is always larger than the second deformation amount with respect to the plurality of shot regions, or the first deformation amount is always smaller than the second deformation amount with respect to the plurality of shot regions.

2. The apparatus according to claim 1, wherein the first deformation amount is constant in all the plurality of shot regions on which the pattern is to be formed.

3. The apparatus according to claim 1, wherein the first deformation amount is determined for all the plurality of shot regions on which the pattern is to be formed such that a difference between the first deformation amount and the second deformation amount for all the plurality of shot regions on which the pattern is to be formed is constant.

4. The apparatus according to claim 1, further comprising a measurement device configured to measure an overlay error between each of the plurality of shot regions and the pattern region,
   wherein the second deformation amount is determined based on measurement by the measurement device.

5. The apparatus according to claim 3, further comprising a measurement device configured to measure an overlay error between each of the plurality of shot regions and the pattern region,
   wherein the first deformation amount is determined based on shape information of the plurality of shot regions that is acquired in advance, and the second deformation amount is determined based on measurement by the measurement device.

6. The apparatus according to claim 1, wherein in the second processing, the second deformation amount is applied to the mold by the actuator to reduce the overlay error between the shot region and the pattern region in a state in which the imprint material and the pattern region are in contact with each other.

7. The apparatus according to claim 1, wherein the overlay error includes a magnification component.

8. The apparatus according to claim 1, wherein the overlay error includes a distortion component.

9. An article manufacturing method comprising:
   forming a pattern on a substrate using an imprint apparatus that forms the pattern in a plurality of shot regions of a substrate by bringing a pattern region of a mold into contact with an imprint material and curing the imprint material, the imprint apparatus comprising:
      a deformation mechanism configured to deform the pattern region, the deformation mechanism including an actuator configured to apply a force to a side surface of the mold,
      wherein, for each shot region, after first processing of applying a first deformation amount to the mold by applying the force to the side surface of the mold by the actuator is executed, second processing of curing the imprint material is executed in a state in which the imprint material and the pattern region are in contact with each other and a second deformation amount is applied to the mold during the second processing by applying the force to the side surface of the mold by the actuator to reduce an overlay error between the shot region and the pattern region while curing the imprint material, and
      wherein the first deformation amount is always larger than the second deformation amount with respect to the plurality of shot regions, or the first deformation amount is always smaller than the second deformation amount with respect to the plurality of shot regions;
   performing processing of the substrate on which the pattern is formed in the forming; and
   manufacturing an article from the processed substrate.

10. An imprint method of forming a pattern in a plurality of shot regions of a substrate by bringing a pattern region of a mold into contact with an imprint material and curing the imprint material, the method comprising:
   for each shot region, executing first processing of applying a first deformation amount to the mold by applying a force to a side surface of the mold by an actuator, and second processing of curing the imprint material after the first processing in a state in which the imprint material and the pattern region are in contact with each other and a second deformation amount is applied to the mold during the second processing by applying the force to the side surface of the mold by the actuator to reduce an overlay error between the shot region and the pattern region while curing the imprint material,
      wherein the first deformation amount is always larger than the second deformation amount with respect to the plurality of shot regions, or the first deformation amount is always smaller than the second deformation amount with respect to the plurality of shot regions.

11. An article manufacturing method comprising:
   forming a pattern on a substrate using the imprint method defined in claim 10; and
   performing processing of a substrate on which the pattern is formed in the forming,
   wherein an article is manufactured from the substrate having undergone the processing.

* * * * *